(12) United States Patent
Wang (10) Patent No.: US 11,249,143 B2
(45) Date of Patent: Feb. 15, 2022

(54) CHARGING APPARATUS AND CHARGING SYSTEM

(71) Applicant: HUAWEI TECHNOLOGIES CO., LTD., Guangdong (CN)

(72) Inventor: Xilin Wang, Dongguan (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 76 days.

(21) Appl. No.: 15/930,883

(22) Filed: May 13, 2020

(65) Prior Publication Data

US 2020/0274373 A1 Aug. 27, 2020

Related U.S. Application Data (63) Continuation of application No. PCT/CN2018/115324, filed on Nov. 14, 2018.

(30) Foreign Application Priority Data

Nov. 14, 2017 (CN) .......................... 201711124480.2

(51) Int. Cl.
*H02J 7/00* (2006.01)
*G01R 31/52* (2020.01)

(52) U.S. Cl.
CPC ............ *G01R 31/52* (2020.01); *H02J 7/0031* (2013.01); *H02J 7/00714* (2020.01)

(58) Field of Classification Search
CPC .................................................. G01R 31/52
USPC ....................................................... 320/134
See application file for complete search history.

(56) References Cited

U.S. PATENT DOCUMENTS

| 5,045,769 A | 9/1991 | Everett, Jr. |
| 6,003,058 A | 12/1999 | Kirschenbaum et al. |
| 7,190,148 B2 * | 3/2007 | Ooshita ................. H02J 7/0029 320/134 |
| 8,541,978 B2 * | 9/2013 | Fukuo ...................... B60L 3/04 320/109 |

(Continued)

FOREIGN PATENT DOCUMENTS

| CN | 103576044 A | 2/2014 |
| CN | 102436365 B | 4/2014 |

(Continued)

*Primary Examiner* — Samuel Berhanu
(74) *Attorney, Agent, or Firm* — Womble Bond Dickinson (US) LLP (57) ABSTRACT

A charging apparatus is disclosed, the apparatus includes a charging circuit including a first voltage conversion circuit configured to convert an alternating current voltage into a first direct current voltage and a switch; a current leakage detection circuit including a second voltage conversion circuit configured to convert the first direct current voltage into a second direct current voltage that does not trigger charging of an electronic device, and the current leakage detection circuit is configured to: detect whether current leakage occurs between a voltage output end and the ground, and output a result at the voltage output end; an in-position detection circuit configured to detect whether the electronic device is in position; and a control circuit configured to: when no current leakage occurs and the electronic device is in position, close the switch, and when it is not in-position, open the switch to prevent the charging.

20 Claims, 6 Drawing Sheets

(56) References Cited

U.S. PATENT DOCUMENTS

| | | | | |
|---|---|---|---|---|
| 2009/0295401 | A1* | 12/2009 | Kamata | G01R 31/52 |
| | | | | 324/509 |
| 2010/0033140 | A1* | 2/2010 | Otake | B60L 3/0069 |
| | | | | 320/165 |
| 2011/0122536 | A1 | 5/2011 | Watanabe et al. | |
| 2015/0234363 | A1 | 8/2015 | Yoon et al. | |
| 2016/0105015 | A1 | 4/2016 | Wang | |

FOREIGN PATENT DOCUMENTS

| | | |
|---|---|---|
| CN | 203722216 U | 7/2014 |
| CN | 103026578 B | 1/2016 |
| CN | 106463974 A | 2/2017 |
| CN | 106655389 A | 5/2017 |
| CN | 208001164 U | 10/2018 |
| EP | 3093945 A1 | 11/2016 |
| EP | 3197007 A1 | 7/2017 |

* cited by examiner

CHARGING APPARATUS AND CHARGING SYSTEM

CROSS-REFERENCE TO RELATED APPLICATIONS

This application is a continuation of International Application No. PCT/CN2018/115324, filed on Nov. 14, 2018, which claims priority to Chinese Patent Application No. 201711124480.2, filed on Nov. 14, 2017, The disclosures of the aforementioned applications are hereby incorporated by reference in their entireties.

TECHNICAL FIELD

The present invention relates to the field of charging technologies, and in particular, to a charging apparatus.

BACKGROUND

As various mobile electronic devices (such a smartphone and a wearable device) develop, a battery capacity of a mobile electronic device is increasingly large, and charging safety has become a problem that cannot be ignored for the mobile electronic device. When a user uses the mobile electronic device, a charging interface of the device may be short-circuited and heated due to water or dust (because the charging interface is contaminated, a power pin of the charging interface has a low-impedance path to the ground, and is heated when a current passes through); or because a charging contact is easily contaminated by user's sweat (especially some wearable devices such as a smartwatch), electrolytic corrosion easily occurs during charging, a port is prone to rustiness, and eventually charging fails due to poor contact.

Figure 1:
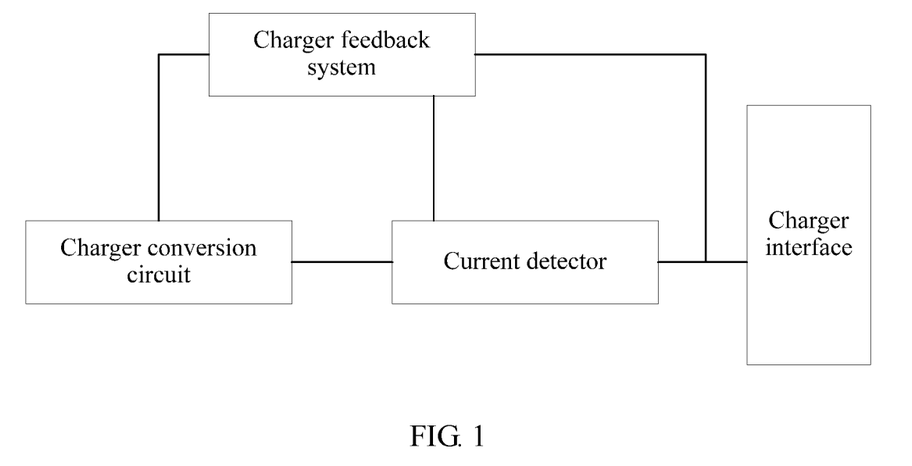
FIG. 1 is a schematic structural diagram of a charging apparatus in the prior art.

FIG. 1 shows a method for resolving the foregoing problem in the prior art. In this solution, a charger conversion circuit is configured to: first convert an alternating current voltage into a low voltage that does not trigger charging of an electronic device, and then detect a leakage current of the electronic device by using a current detector. If the leakage current is greater than a preset current value, it indicates that there is dirt (such as water, dust, or sweat) on a charger interface of the electronic device, and a charger feedback system is triggered to trigger a charging protection circuit to forbid charging of the electronic device. If no dirt is detected through current detection, the charger conversion circuit is used to convert an alternating current power supply into a voltage that is able to charge the electronic device, to charge the electronic device.

The current detector in the prior art needs to use some components that need to convert a current into a voltage, such as a Hall effect component and an analog-to-digital converter. Therefore, this implementation is quite complicated and requires relatively high costs.

SUMMARY

According to a first aspect, this application provides a charging apparatus. The charging apparatus is configured to charge an electronic device and includes a charging circuit, a current leakage detection circuit, a control circuit, an in-position detection circuit, and a voltage output end.

The charging circuit includes a first voltage conversion circuit and a first switch, where an input end of the first voltage conversion circuit is coupled to an alternating current power supply, an output end of the first voltage conversion circuit is coupled to the voltage output end by using the first switch, and a control end of the first switch is coupled to the control circuit;

the current leakage detection circuit includes a second voltage conversion circuit and a serial resistor, where an input end of the second voltage conversion circuit is coupled to the output end of the first voltage conversion circuit, an output end of the second voltage conversion circuit is coupled to the voltage output end by using the serial resistor, and the current leakage detection circuit is configured to: detect whether current leakage occurs between the voltage output end and the ground, and output a current leakage detection result by using the voltage output end;

the first voltage conversion circuit is configured to convert an input alternating current voltage into a first direct current voltage;

the second voltage conversion circuit is configured to convert the first direct current voltage into a second direct current voltage that is lower than the first direct current voltage and that does not trigger charging of the electronic device;

the in-position detection circuit is configured to: detect whether the electronic device is in position to obtain an in-position signal that is used to indicate whether the electronic device is in position, and output the in-position signal to the control circuit;

the control circuit is configured to: when it is determined, based on the current leakage detection result, that no current leakage occurs and it is determined, based on the in-position signal, that the electronic device is in position, close the first switch by using the control end of the first switch, so that the first direct current voltage output by the first voltage conversion circuit is able to charge the electronic device; and the control circuit is further configured to: when it is determined that current leakage occurs or that the electronic device is not in-position, open the first switch to prevent the first direct current voltage from charging the electronic device.

In this embodiment of this application, the current leakage detection circuit performs determining by using the voltage output end instead of a current detector. In this way, current leakage detection can be performed by only using a resistor, and some components that need to convert a current into a voltage, such that a high-cost Hall effect component and/or an analog-to-digital converter are not required. Therefore, this implementation is simpler and requires lower costs. In one embodiment, the electronic device includes an in-position detection circuit. If the in-position circuit detects the electronic device is in an in-position state and a current leakage is not detected (due to dirt), the first switch can be closed to charge the electronic device. The in-position circuit can avoid an erroneous detection of current leakage. If in-position detection is not performed and detection is performed only by using the current leakage detection circuit, a detection result of the current leakage detection circuit may be that no current leakage occurs when the charging apparatus is not coupled to the electronic device. In this case, the charging circuit charges the electronic device. However, because this detection process is performed when the electronic device is not in-position, and is not performed in an actual in-position use scenario (for example, a USB cable is plugged into a mobile phone), the detection result obtained by the current leakage detection circuit may be an erroneous result. If the result is erroneous, when the charging circuit charges the electronic device, problems such as a short-circuit, heating, and corrosion may occur, resulting in damage to the charging apparatus or the electronic device. In this embodiment, whether current leakage occurs needs to be determined in an in-position state, and in this case, current leakage detection is performed in an actual in-position scenario. In this way, no erroneous judgment is generated.

In one embodiment, the first switch is in an open state by default when the charging apparatus is coupled to the alternating current power supply. In this way, an electronic device that may have dirt can be prevented from being charged when the charging apparatus is coupled to the alternating current power supply, thereby improving charging safety.

In one embodiment, the in-position detection circuit includes a contact switch. The contact switch is configured to be pressed when the charging apparatus is coupled to the electronic device and to generate a first in-position signal that is used to indicate an in-position state. The contact switch is suitable for a charging apparatus that charges a device such as a smartwatch by using a base. When the electronic device is being charged, the electronic device is placed on the base, and a button of the contact switch is pressed to output the first in-position signal.

In one embodiment, the in-position detection circuit is specifically configured to detect, based on an identifier (ID) pin or a configuration channel (CC) pin on a charging interface of the electronic device, whether the electronic device is in position. This implementation is suitable for a charging apparatus that charges a smartphone. When the charging apparatus is coupled to the smartphone through a USB cable, detection may be performed by using an ID pin or a CC pin on the mobile phone.

In one embodiment, the control circuit includes a bleeder circuit, a comparator, and a NAND gate circuit.

The bleeder circuit is configured to divide the second direct current voltage to obtain a bleeder signal output by an output end of the bleeder circuit;

the output end of the bleeder circuit is coupled to an inverting input end of the comparator;

a non-inverting input end of the comparator is coupled to the voltage output end;

an output end of the comparator is coupled to one input end of the NAND gate circuit;

another input end of the NAND gate circuit is coupled to one end at which the in-position detection circuit outputs the in-position signal; and an output end of the NAND gate circuit is coupled to the control end of the first switch.

The control circuit is easy to implement and requires low costs.

In one embodiment, the current leakage detection circuit further includes a second switch.

The second switch is coupled in series to a serial circuit including the output end of the second voltage conversion circuit, the serial resistor, and the voltage output end;

a control end of the second switch is coupled to the control circuit; and the control circuit is further configured to control, by using the control end of the second switch, the second switch to be in a closed state when the current leakage detection circuit detects whether current leakage occurs.

The second switch can prevent an output voltage of the first voltage conversion circuit from being reversely input to the second voltage conversion circuit, thereby better protecting the second voltage conversion circuit.

In one embodiment, the control circuit is further configured to: when the first switch is closed, open the second switch by using the control end of the second switch. In this way, a voltage output by the charging circuit can be prevented from being reversely input to the current leakage detection circuit and the second voltage conversion circuit can be prevented from being damaged.

In one embodiment, the second switch is in a closed state by default when the charging apparatus is coupled to the alternating current power supply. In this way, detection can be performed when the charging apparatus is coupled to the alternating current power supply.

In one embodiment, one end, coupled to the control end of the first switch, of the control circuit is coupled to the control end of the second switch by using a phase inverter. In this way, a state of the second switch is opposite to that of the first switch, thereby ensuring that the charging circuit and the current leakage detection circuit do not work at the same time, preventing the charging circuit and the current leakage detection circuit from affecting each other, and further improving charging safety.

In one embodiment, a voltage output by the second voltage conversion circuit is 1.8 V. The voltage is a common voltage, is easy to implement, and requires low costs.

In one embodiment, the second voltage conversion circuit is a low dropout regulator. When this method is used, the implementation is simple and requires low costs.

In one embodiment, the first switch and the second switch are both PMOSs. The PMOS is a common switch component, and an extra component is not required in cooperation with another logic circuit (such as a phase inverter or a comparator). This implementation is simple and requires low costs.

In one embodiment, the control circuit includes a microcontroller unit (MCU), and a more complicated function can be implemented through control by the MCU.

In one embodiment, when the control circuit includes an MCU, the in-position detection circuit may be implemented by detecting a voltage at two ends of a resistor coupled in series to a circuit between the output end of the first voltage conversion circuit and the voltage output end. Specifically, a resistor may be added to the charging circuit, then a voltage at two ends of the resistor is detected, the voltage is amplified by using an amplifier, and an amplified voltage is output to an analog-to-digital converter (ADC) in the MCU; and the ADC converts a received analog signal into a digital signal, and detects an in-position state based on the digital signal. In this manner, correspondingly, when detecting an in-position state, the MCU needs to control the first switch to be closed, to determine whether the charging circuit forms a loop with the electronic device, and if yes, the voltage at the two ends of the serial resistor is greater than a predetermined value, and this may indicate an in-position state. More complicated control can be implemented by the MCU to enhance a function of a charger.

According to a second aspect, this application discloses a charging system, including an electronic device and the charging apparatus disclosed in the first aspect and the implementations of the first aspect. The charging apparatus is configured to charge the electronic device. When this charging system is used, because the first aspect and the implementations of the first aspect are used, technical effects that are the same as those in the first aspect and the implementations of the first aspect can be achieved.

In an implementation of the second aspect, the charging system further includes a USB cable used to connect the charging apparatus and the electronic device. When the USB cable is used for connection, this implementation is simple and requires low costs.

BRIEF DESCRIPTION OF DRAWINGS

To describe the technical solutions in the embodiments of the present invention or in the prior art more clearly, the following briefly describes the accompanying drawings required for describing the embodiments or the prior art. Apparently, the accompanying drawings in the following description show merely some embodiments of the present invention, and a person of ordinary skill in the art may derive other drawings from these accompanying drawings without creative efforts.

DESCRIPTION OF EMBODIMENTS

The following describes the embodiments of the present invention with reference to accompanying drawings.

Embodiment 1

Figure 2:
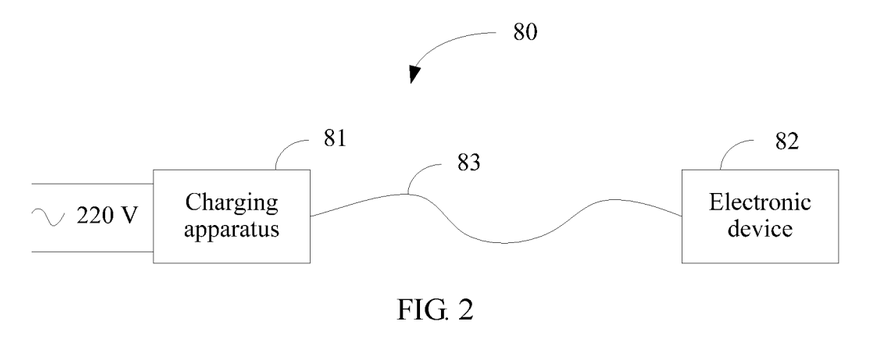
FIG. 2 is a schematic structural diagram of a charging system.

Referring to FIG. 2, this application discloses a charging apparatus. The charging apparatus 81 may be a power adapter (or referred to as a "charger"), and is configured to charge an electronic device 82 (any mobile electronic device such as a smartphone or a wearable device). The power adapter is usually sold with the electronic device. An end of the power adapter is coupled to an alternating current (for example, 220 V mains), and another end outputs a direct current voltage (for example, 5 V) and charges the electronic device 82 by using the output voltage through a cable 83 (for example, a cable based on a USB interface).

Figure 3:
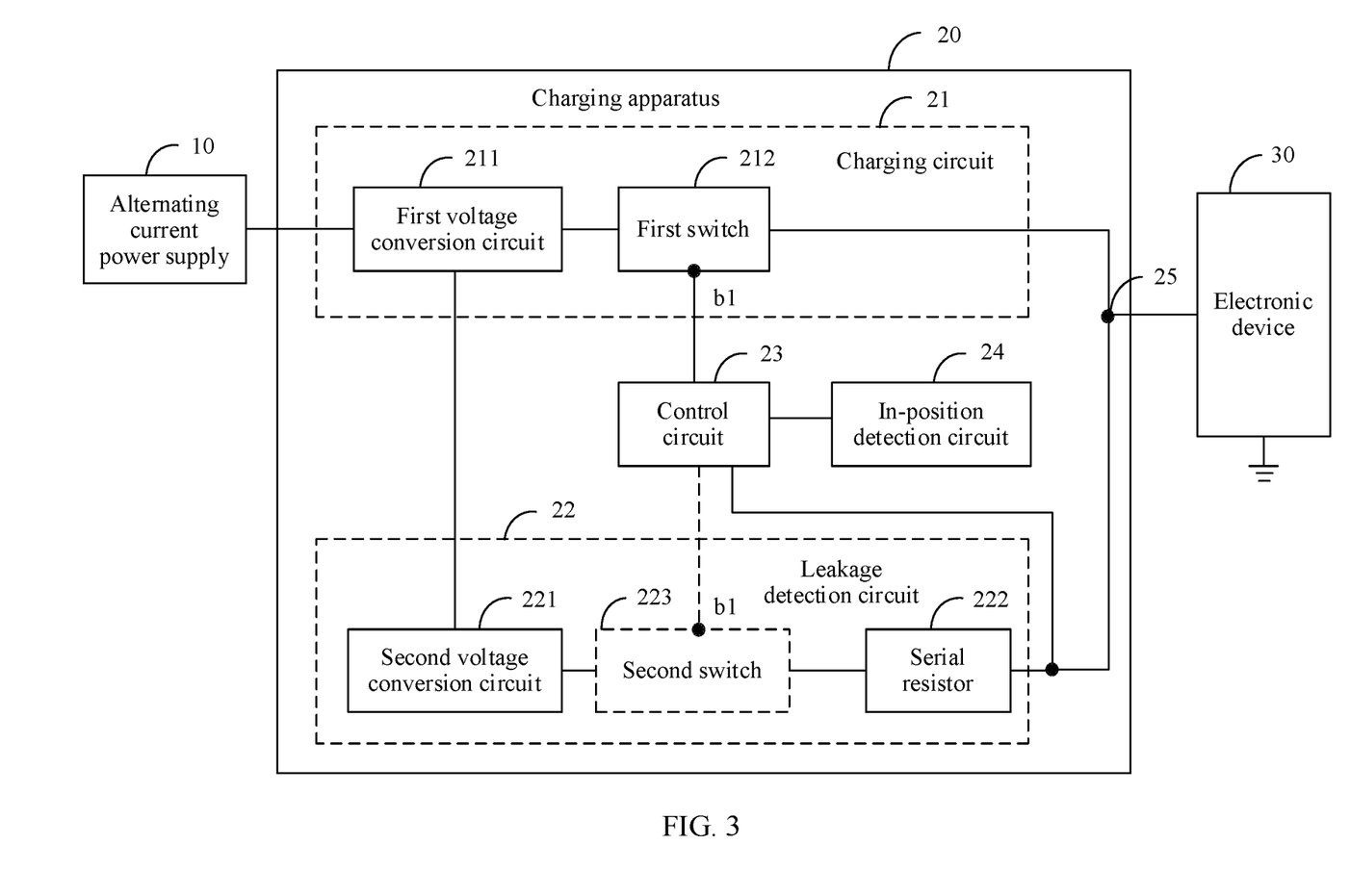
FIG. 3 is a schematic structural diagram of a charging apparatus according to Embodiment 1 of the present invention.

Referring to FIG. 3, a charging apparatus in this embodiment includes a charging circuit 21, a current leakage detection circuit 22, a control circuit 23, an in-position detection circuit 24, and a voltage output end 25.

The charging circuit 21 includes a first voltage conversion circuit 211 and a first switch 212. An input end of the first voltage conversion circuit is coupled to an alternating current power supply, an output end of the first voltage conversion circuit is coupled to the voltage output end 25 by using the first switch, and a control end of the first switch is coupled to the control circuit. The voltage output end 25 may be physically a pin of an output interface of the charging apparatus, or may further include a part or an entire of a signal cable (such as a short piece of copper cable coupled to the pin on a PCB) that is directly coupled to the pin in the charging apparatus but does not pass through another electronic part and component. This is not strictly distinguished in this application.

The current leakage detection circuit 22 includes a second voltage conversion circuit 221 and a serial resistor 222. An input end of the second voltage conversion circuit 221 is coupled to the output end of the first voltage conversion circuit 211, and an output end of the second voltage conversion circuit 221 is coupled to the voltage output end 25 by using the serial resistor 222; and the current leakage detection circuit 22 is configured to: detect whether current leakage occurs between the voltage output end 25 and the ground, and output a current leakage detection result by using the voltage output end 25. Specifically, when the charging apparatus is not coupled to an electronic device, it may be considered that a resistor with an infinite resistance value is coupled between the voltage output end 25 and the ground, and when the charging apparatus is coupled to the electronic device, it may be considered that an equivalent resistance with a specific resistance value is coupled between the voltage output end 25 and the ground. A voltage at the voltage output end 25 changes as a resistance value changes. If no current leakage occurs, the voltage output end 25 outputs a high level; or if current leakage occurs, the voltage output end 25 outputs a low level, and the control circuit 23 may determine, based on an output of the voltage output end, whether current leakage occurs between the voltage output end 25 and the ground.

The first voltage conversion circuit 211 is configured to convert an input alternating current voltage (output by an alternating current power supply 10) into a first direct current voltage. Specific implementation of the first voltage conversion circuit is the prior art, and details are not described in this application.

The second voltage conversion circuit 221 is configured to convert the first direct current voltage into a second direct current voltage that is lower than the first direct current voltage and that does not trigger charging of the electronic device.

The in-position detection circuit 24 is configured to: detect whether an electronic device 30 is in position (in other words, whether the electronic device 30 has been coupled to the charging apparatus) to obtain an in-position signal that is used to indicate whether the electronic device is in position, and output the in-position signal to the control circuit 23.

The control circuit 23 is further configured to: when it is determined, based on the current leakage detection result, that no current leakage occurs in the electronic device 30 and it is determined, based on the in-position signal, that the electronic device 30 is in position, close the first switch by using a control end b1 of the first switch 212, so that the first direct current voltage output by the first voltage conversion circuit is able to charge the electronic device. In an implementation, the first switch is in an open state by default when the charging apparatus is coupled to the alternating current power supply. In this way, the charging apparatus can be prevented from charging an electronic device with current leakage, thereby improving charging safety.

The control circuit 23 is further configured to: when it is determined that current leakage occurs in the electronic device 30 or it is determined, based on the in-position signal, that the electronic device is not in-position, open the first switch 212 by using the control end b1 of the first switch 212, to prevent the first direct current voltage from charging the electronic device.

Embodiment 2

Based on Embodiment 1, Embodiment 2 of this application discloses a charging apparatus. Referring to FIG. 3, compared with Embodiment 1, the current leakage detection circuit 22 in this embodiment further includes a second switch 223.

The second switch 223 is coupled in series to a serial circuit including the output end of the second voltage conversion circuit (it is learned from the figure that the output end is on the right side of the second voltage conversion circuit), the serial resistor 222, and the voltage output end 25. For example, as shown in FIG. 3, the second switch 223 may be coupled in series between the second voltage conversion circuit and the serial resistor 222, or may be coupled in series between the serial resistor 222 and the voltage output end 25.

A control end b1 of the second switch 223 is coupled to the control circuit 23.

The control circuit 23 is further configured to control, by using the control end b1 of the second switch, the second switch 223 to be in a closed state when the current leakage detection circuit detects whether current leakage occurs.

In this embodiment, when controlling the first switch to be closed, the control circuit 23 opens the second switch by using the control end of the second switch.

The second switch is in a closed state by default when the charging apparatus is coupled to the alternating current power supply. In this case, while the charging apparatus is coupled to the alternating current power supply, the current leakage detection circuit may detect whether current leakage detection occurs.

In this embodiment, the second switch is newly added to a leakage circuit, and the second switch is in an open state when the charging circuit charges the electronic device by using the output end 25. In this case, a voltage at the output end 25 is not input to the second voltage conversion circuit, thereby further improving safety of the second voltage conversion circuit (if a voltage higher than the voltage output by the output end is input to the output end of the second voltage conversion circuit, the second voltage conversion circuit may be damaged).

Figure 6:
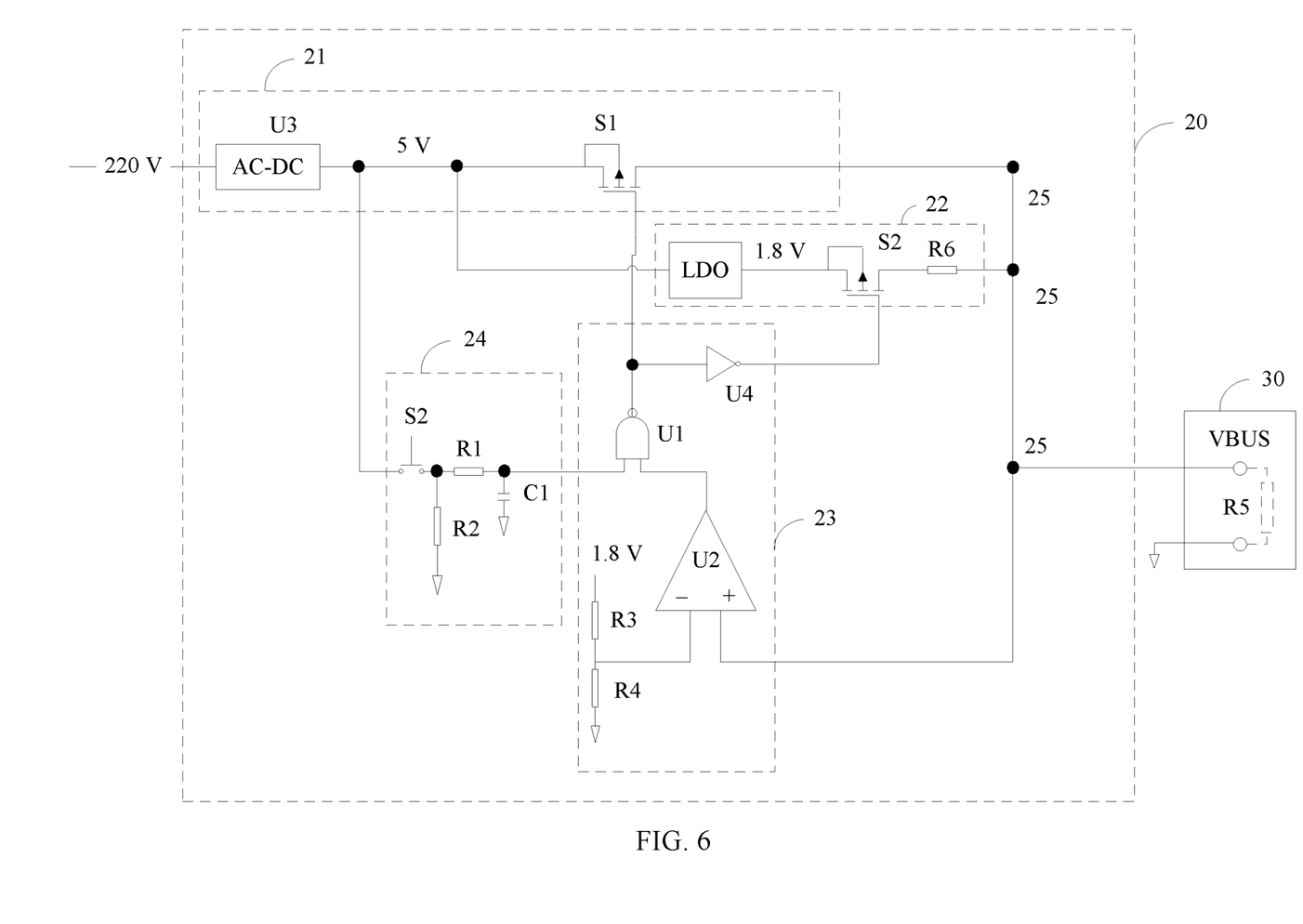
FIG. 6 is a schematic structural diagram of a charging apparatus according to Embodiment 6 of the present invention.

In a specific example, FIG. 6 may show a circuit including the second switch. The following embodiments provide specific description for an operating principle of the circuit in FIG. 6.

Embodiment 3

Figure 4:
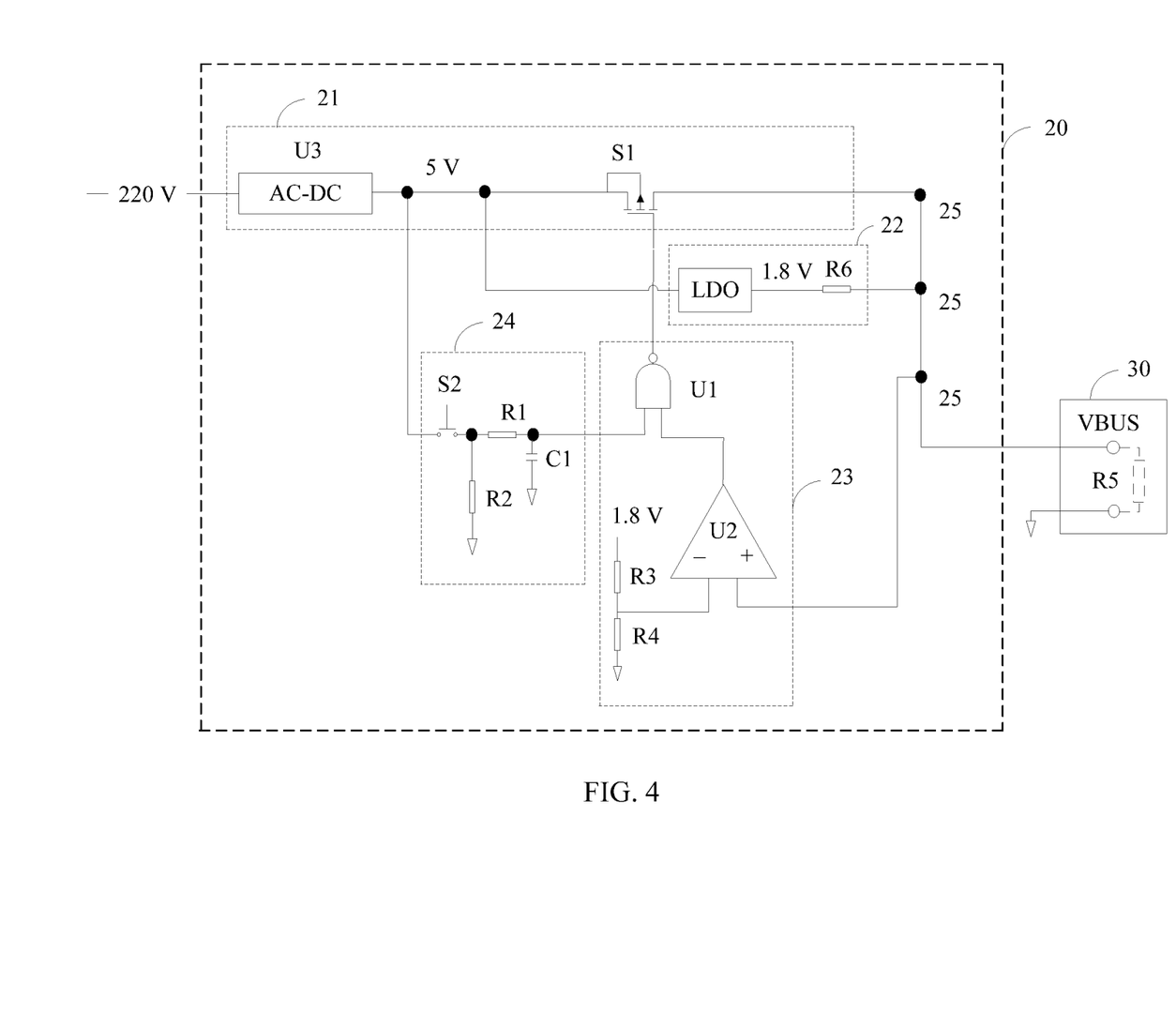
FIG. 4 is a schematic structural diagram of a charging apparatus according to Embodiment 3 of the present invention.

Referring to FIG. 4, based on the foregoing embodiments, this embodiment provides specific description for the in-position detection circuit in Embodiment 1 or Embodiment 2.

The in-position detection circuit 24 includes a contact switch S2. The contact switch is configured to be pressed when the charging apparatus is coupled to the electronic device and to generate a first in-position signal that is used to indicate an in-position state. Specifically, the contact switch is a switch for triggering an open state or a closed state by using a button. If the button is pressed, the switch is closed and a current may flow through the switch. On the contrary, if the button is not pressed, the switch is opened and a current cannot flow through the switch, forming a discoupled circuit.

The in-position detection circuit 24 may further include other auxiliary electronic parts and components in cooperation with the contact switch S2. These auxiliary electronic parts and components cooperate with the switch to form a loop including the switch, to detect whether the electronic device is in position.

FIG. 4 is a schematic diagram of a specific in-position detection circuit. The in-position detection circuit includes the contact switch S2, a first resistor R1, a second resistor R2, and a first capacitor C1.

One end of the contact switch S2 is coupled to an output end of a first voltage conversion circuit U3, and the other end of the contact switch S2 is coupled to one end of the first resistor R1 and one end (a first end) of the second resistor R2.

The other end (a second end) of R1 is coupled in series to the first capacitor C1 and then is coupled to the ground, and a signal output by the second end of R1 is an in-position signal. The other end of R2 is coupled to the ground.

In the foregoing specific circuit, when the button of S2 is not pressed, the in-position signal is a low level (R2 may be considered as a pull-down resistor to pull down the signal to 0), and when the button of S2 is pressed, the in-position signal is a high level (for example, 5 V) because an output of U3 is coupled, that is, the first in-position signal is a high level.

The in-position detection circuit in this embodiment is relatively applicable to a scenario of charging a smartwatch. Currently, when the smartwatch is being charged, the smartwatch can be placed on a base. In this case, the contact switch may be disposed on a side of the base that faces the smartwatch. When the smartwatch is placed on the base, a button of the contact switch is pressed and the switch is closed, so that an in-position signal is output as a high level (5 V), indicating an in-position state. In other words, the high level in-position signal indicates the smartwatch is placed on the base or in position.

Figure 5:
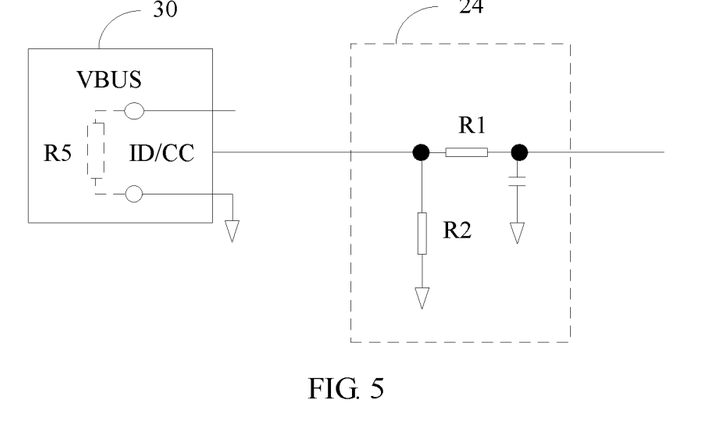
FIG. 5 is a schematic diagram of another in-position detection circuit according to an embodiment of the present invention.

Referring to FIG. 5, in another embodiment, the in-position detection circuit 24 is specifically configured to detect, based on an identifier (ID) pin or a configuration channel (CC) pin on a charging interface of the electronic device, whether the electronic device is in position. The ID pin is usually for an OTG interface. To be specific, if the charging apparatus is coupled to the electronic device through the OTG interface, detection may be performed based on the ID pin of the electronic device. The CC pin is usually for a Type C interface. To be specific, if the charging apparatus is coupled to the electronic device through the Type C interface, detection may be performed based on the CC pin of the electronic device.

In this embodiment, the in-position detection circuit is configured to: form a loop based on the identifier (ID) pin or the configuration channel (CC) pin on the charging interface of the electronic device, and detect an in-position state by using the loop.

Specifically, the in-position detection circuit 24 in this embodiment includes:

a first resistor R1, a second resistor R2, and a first capacitor C1.

One end (a first end) of R1 and one end of R2 are coupled to the ID pin or the CC pin of the electronic device.

The other end of R2 is coupled to the ground.

The other end (a second end) of R1 is coupled in series to C1 and then is coupled to the ground, and the second end of R1 is further configured to output an in-position signal.

In this embodiment, the CC pin is coupled to a power supply in the electronic device by using a pull-up resistor in the electronic device. Therefore, when the charging apparatus is electrically coupled to the electronic device (indicating an in-position state), the in-position signal is output as a high level; and if there is no connection (indicating a not-in-position state), the in-position signal is pulled down to a low level (0) by R2.

Embodiment 4

Referring to FIG. 4, based on the foregoing embodiments, this embodiment provides specific description for the charging circuit 21, the current leakage detection circuit 22, and the control circuit 23 in Embodiment 1 or Embodiment 2.

Referring to FIG. 4, in this embodiment, the charging circuit 21 specifically includes an AC-DC conversion circuit (U3), configured to convert a voltage 220 V into a voltage 5 V (certainly, in another embodiment, the voltage 220 V may alternatively be converted into another voltage such as 9 V that can charge the electronic device). The charging circuit 21 further includes a switch S1 and is coupled to the voltage output end 25 by using the switch S1. The switch S1 in this embodiment may be specifically implemented as a p-channel metal-oxide-semiconductor field-effect transistor (PMOSFET, "PMOS" for short). Certainly, another switch component such as a transistor or a relay may alternatively be used. The charging circuit 21 is mainly configured to charge the electronic device. For a circuit design of the charging circuit 21, refer to the prior art. In this embodiment, the switch S1 is added to the charging circuit 21. In this case, the charging circuit 21 may be controlled not to charge the electronic device in some cases (for example, current leakage occurs), thereby improving charging safety.

The current leakage detection circuit 22 includes a low dropout regulator (LDO) and a sixth resistor R6. The LDO is the second voltage conversion circuit in Embodiment 1 or Embodiment 2, and is configured to convert a circuit 5 V output by the AC-DC conversion circuit U3 into a voltage such as 1.8 V that does not trigger charging of the electronic device. For example, the LDO regulator may be an LM1086 chip of Texas Instruments (TI).

In this embodiment, the control circuit 23 includes a third resistor R3, a fourth resistor R4, a comparator U2, and a NAND gate circuit U1.

One end (a first end) of the third resistor R3 is coupled to the output end of the second voltage conversion circuit LDO (that is, the voltage 1.8 V output by the LDO is input by using the first end of R3).

The other end (a second end) of the third resistor R3 is coupled in series to the fourth resistor R4 and then is coupled to the ground.

The other end of the third resistor R3 is further coupled to an inverting input end of the comparator U2.

A non-inverting input end of the comparator U2 is coupled to the voltage output end 25.

An output end of the comparator U2 is coupled to one input end of the NAND gate circuit U1.

Another input end of the NAND gate circuit U1 is coupled to one end at which the in-position detection circuit 24 outputs the in-position signal (that is, an end R1 coupled to C1 in FIG. 3).

An output end of the NAND gate circuit is coupled to the control end of the first switch S1.

In this embodiment, values of R3, R4, and R6 need to meet the following relationship: "When no current leakage occurs, a voltage at a non-inverting end of U2 is higher than a voltage at an inverting end of U2, and when current leakage occurs, the voltage at the non-inverting end of U2 is lower than the voltage at the inverting end of U2". According to the foregoing principle, in an example, if an equivalent resistance R5 between a VBUS pin of the electronic device and the ground is 100k ohms when no current leakage occurs and is lower than 20k ohms when current leakage occurs, a resistance of R3 may be 10k ohms, a resistance of R4 may be 30k ohms, and a resistance of R6 may be 10k ohms. Based on the foregoing specific resistance values, the following provides specific description for an output of U2 when current leakage occurs and when no current leakage occurs.

When no current leakage occurs, the voltage at the voltage output end (the non-inverting input end of U2) is about 1.8×100k/(100k+10k) and is approximately equal to 1.64 V, and the inverting input end of U2 is about 1.8×3/(1+3)=1.35 V. The voltage at the non-inverting input end of U2 is higher than the voltage at the inverting input end.

When current leakage occurs, a maximum voltage at the voltage output end (the non-inverting input end of U2) is about 1.8×20k/(20k+10k) and is approximately equal to 1.2 V, and the inverting input end of U2 is about 1.8×3/(1+3)=1.35 V. The voltage at the non-inverting input end of U2 is lower than the voltage at the inverting input end.

Embodiment 5

Referring to FIG. 4, based on the foregoing embodiments, this embodiment provides specific description for an operating principle of the charging apparatus in FIG. 4. It should be noted that sequence numbers in the following paragraphs are merely intended to distinguish between different description parts, but do not represent a strict execution order.

(1) When the charging apparatus is coupled to the alternating current power supply (220 V) but is not coupled to the electronic device, an operating principle of each part and component in the circuit is as follows:

U3 in the charging circuit 21 converts a voltage 220 V into a voltage 5 V.

The LDO in the current leakage detection circuit 22 converts the voltage 5 V into a voltage 1.8 V. Because the charging apparatus is not coupled to the electronic device, the voltage output end 25 is suspended and may be considered as a resistor with an infinite resistance value. In this case, the voltage at the voltage output end 25 (namely, the current leakage detection result) is about 1.8 V and is output to the non-inverting input end of U2.

The in-position signal output by the in-position detection circuit 24 is a low level (is pulled down to 0 by R2) because the charging apparatus is not coupled to the device and the button of the contact switch S2 is not pressed.

A voltage at two ends of R4 in the control circuit 23 is about 1.8 V×3/(1k+3k)=1.35 V (it is assumed that R3=1k ohms and R4=3k ohms) and is input to the inverting input end of U2.

Because the voltage (1.8 V) at the non-inverting input end of U2 in the control circuit 23 is higher than the voltage (1.35 V) at the inverting input end, a high level is output, in other words, it is determined that no current leakage occurs.

Two inputs of U1 (the NAND gate) in the control circuit 23 are a low level (the in-position signal is low-level) and a high level (the output of U2 is high-level), and therefore an output of U1 is 1 and S1 is opened, in other words, the charging circuit is opened.

(2) When the charging apparatus is coupled to both the alternating current power supply and the electronic device, if no current leakage occurs on the electronic device, an equivalent resistance between the VBUS in the electronic device and the ground is assumed as 100k in this case. Because the equivalent resistance is much higher than R6 (10k), the voltage at the voltage output end 25 is about 1.64 V, and the voltage input to the non-inverting input end of the comparator U2 is still higher than a voltage (1.35 V) at the inverting input end. In this case, an output of U2 is still high-level (with logic "1") and the high level is input to a first input end of U1 (the input end on the right side of the figure).

For a second input end of U1 (the input end on the left side of the figure), because the charging apparatus is coupled to the electronic device, the button of S2 is pressed and S2 is closed. In this case, the in-position signal (that is, an output of the second end of R1) is high-level (5 V), that is, an input of the second input end of U1 is high-level.

Because U1 is a NAND gate circuit, when the two inputs are high-level, a low level is output. In this case, S1 is conducted. In other words, the charging circuit is conducted and may charge the electronic device.

(3) When the charging apparatus is coupled to both the alternating current power supply and the electronic device, if current leakage occurs on the electronic device, an equivalent resistance between the VBUS in the electronic device and the ground is lower (which is assumed as 10k). In this case, the voltage at the voltage input end 25 is about 0.9 V and the voltage is input to the non-inverting input end of the comparator U2. Because the voltage (0.9 V) at the non-inverting input end is lower than a voltage (1.35 V) at the inverting input end, a low level is output and is input to the first end of U1.

Because U1 is a NAND gate, the output of U1 is high-level if one end of U1 is low-level. In this case, S1 is not closed. In other words, the charging circuit is still in an open state, and a voltage obtained by U3 through conversion cannot charge the leaky electronic device, thereby improving charging safety.

In case (3), if current leakage always occurs, the state in case (3) is always maintained. If current leakage is eliminated, processing is performed based on case (2). If the charging apparatus is discoupled from the electronic device, processing is performed based on case (1).

Embodiment 6

Referring to FIG. 6, based on the foregoing embodiments, this embodiment describes an operating principle of the charging apparatus in which the current leakage detection circuit in Embodiment 2 further includes a second switch S2 (which is also implemented based on a PMOS). Because the circuit in this embodiment is almost the same as that in Embodiment 5, the following only provides specific description for an operating principle of the second switch. For other parts, refer to the description in Embodiment 5. Details are not described again in this embodiment. It should be noted that, sequence numbers in the following paragraphs are merely intended to distinguish between different description parts, but do not represent a strict execution order.

(1) When the charging apparatus is coupled to the alternating current power supply (220 V) but is not coupled to the electronic device, it can be learned from the analysis in Embodiment 5 that U1 outputs a high level, the high level is converted into a low level after passing through a phase inverter U4 of the control circuit, the low level is input to a control end of S2, and the PMOS transistor is conducted (which is equivalent to that S2 is closed), so that the current leakage detection circuit 22 operates.

(2) When the charging apparatus is coupled to both the alternating current power supply and the electronic device, if no current leakage occurs on the electronic device, it can be learned from the analysis in Embodiment 5 that U1 outputs a low level, and after the low level passes through a phase inverter U4, U4 outputs a high level, the high level is input to a control end of S2, and the PMOS is cut off (which is equivalent to that S2 is opened). In this case, when the charging circuit operates, the voltage at the voltage output end 25 is not reversely added to the LDO, thereby further ensuring safety of the LDO.

(3) When the charging apparatus is coupled to both the alternating current power supply and the electronic device, if current leakage occurs on the electronic device, it can be learned from the analysis in Embodiment 5 that U1 outputs a high level, and after the high level passes through a phase inverter U4, U4 outputs a low level, the low level is input to a control end of the PMOS, and the PMOS is conducted (which is equivalent to that S2 is closed), so that the current leakage detection circuit 22 operates. If current leakage always occurs, this state is always maintained until current leakage is eliminated. In this case, processing is performed based on case (2).

Embodiment 7

Figure 7:
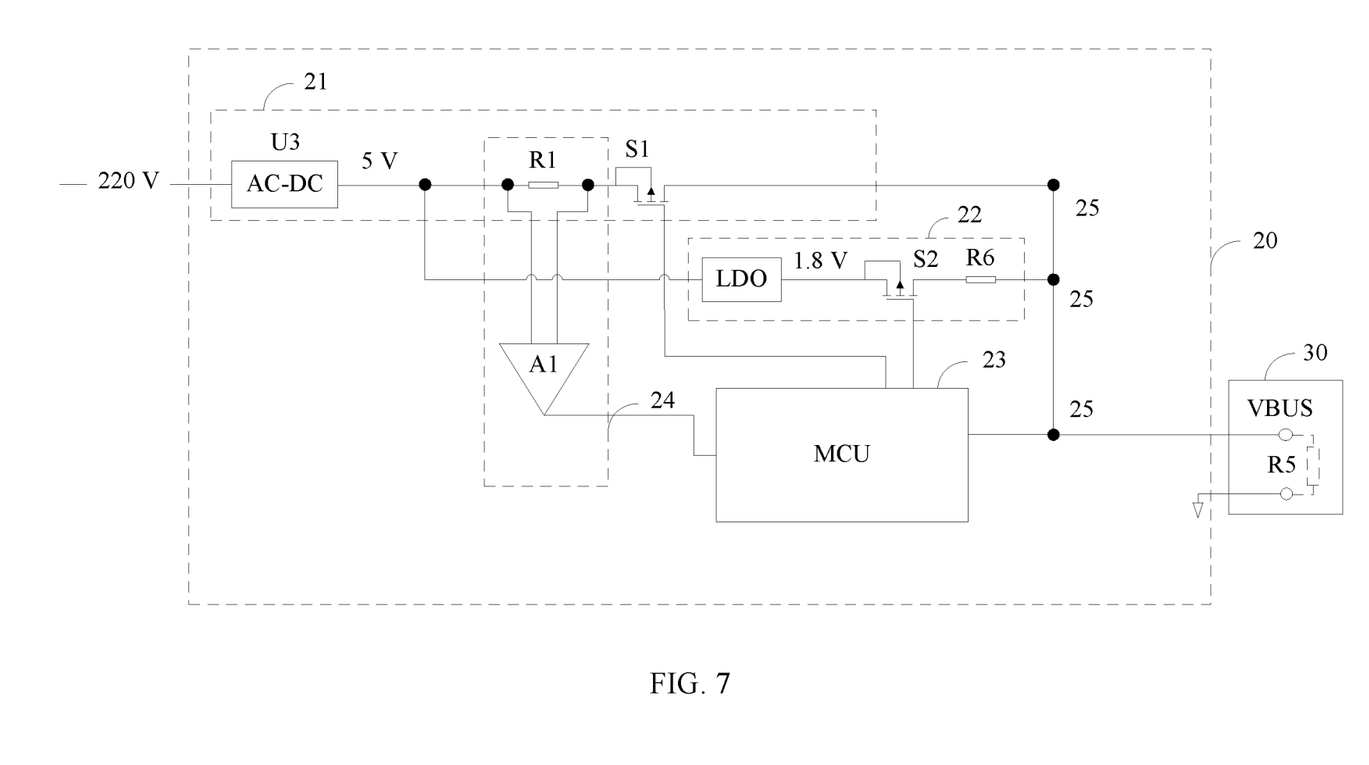
FIG. 7 is a schematic structural diagram of a charging apparatus according to Embodiment 7 of the present invention.

Referring to FIG. 7, based on the foregoing embodiments, in this embodiment, a main change relative to the foregoing embodiments is that the control circuit changes to an MCU (microcontroller unit), and various control operations are implemented by using the MCU. The MCU is usually a processor with an instruction processing capability, such as a single-chip microcomputer or a CPU, and the MCU is also integrated with an analog-to-digital converter (ADC) function.

Referring to FIG. 7, the following provides specific description for various circuits in this embodiment.

The charging circuit 21 includes the AC-DC conversion circuit (U3), the first resistor R1, and the first switch S1. For description of U3 and S1, refer to the foregoing embodiments. A value the first resistor R1 may be 10 milliohms to 100 milliohms, and S1 is still a PMOS transistor as the foregoing embodiments.

For composition of the current leakage detection circuit 22, refer to the description of the foregoing embodiments. Details are not described again. The current leakage detection result is output to an MCU 23.

The in-position detection circuit 24 includes the first resistor R1 and an amplifier A1, and an output end of A1 is configured to output an in-position detection result to one input end of the MCU. A principle of the in-position detection circuit 24 is to detect a voltage at two ends of R1, then the voltage is amplified by using the amplifier A1, and an amplified voltage is output to one input end of the MCU. It should be noted that a method of the in-position detection circuit in this embodiment is also applicable to a circuit including a discrete part and component in the foregoing embodiments. Certainly, a function of the MCU may alternatively be implemented by a discrete part and component. A specific implementation method is a technology well known by a person skilled in the art, and details are not described herein.

The control circuit includes the MCU 23, the input end at which the MCU receives the in-position detection result is an ADC input end. Analog-to-digital conversion is performed on an analog voltage input by the input end in the MCU, to convert the analog voltage into a digital signal, and it is determined whether a specific threshold is exceeded. If yes, it is determined that the electronic device is in position; otherwise, it is determined that the electronic device is not in-position. The MCU controls, based on the current leakage detection result by determining whether the electronic device is in position, S1 and S2 to be closed and opened. For a method for determining time at which S1 and S2 are closed or opened, refer to the foregoing embodiments. Details are not described again.

Embodiment 8

Referring to FIG. 2, based on the foregoing embodiments, this embodiment discloses a charging system 80, including the charging apparatus 81 and the electronic device 82. The charging apparatus 81 is coupled to the electronic device 82 through a cable 83 (where the cable 83 usually has a data transmission function, and is usually referred to as a data cable in this case). The charging apparatus may be based on the charging apparatus in any one of Embodiment 1 to Embodiment 7.

In the foregoing example embodiments, the objectives, technical solutions, and advantages of the present invention are further described in detail. It should be understood that the foregoing descriptions are merely example embodiments of the present invention, but are not intended to limit the present invention. Any modification, equivalent replacement, and improvement made without departing from the spirit and principle of the present invention shall fall within the protection scope of the present invention.

What is claimed is:

1. A charging apparatus, configured to charge an electronic device and comprising a charging circuit, a current leakage detection circuit, a control circuit, an in-position detection circuit, and a voltage output end, wherein
the charging circuit comprises a first voltage conversion circuit and a first switch, wherein an input end of the first voltage conversion circuit is coupled to an alternating current power supply, an output end of the first voltage conversion circuit is coupled to the voltage output end through the first switch, and a control end of the first switch is coupled to the control circuit;
the current leakage detection circuit comprises a second voltage conversion circuit and a serial resistor, wherein an input end of the second voltage conversion circuit is coupled to the output end of the first voltage conversion circuit, an output end of the second voltage conversion circuit is coupled to the voltage output end through the serial resistor, and the current leakage detection circuit is configured to: detect whether current leakage occurs between the voltage output end and a ground, and output a current leakage detection result at the voltage output end;
the first voltage conversion circuit is configured to convert an input alternating current voltage into a first direct current voltage;
the second voltage conversion circuit is configured to convert the first direct current voltage into a second direct current voltage that is lower than the first direct current voltage and that does not trigger charging of the electronic device;
the in-position detection circuit is configured to: detect whether the electronic device is in position to generate an in-position signal that is used to indicate whether the electronic device is in position, and output the in-position signal to the control circuit;
the control circuit is configured to: when it is determined, based on the current leakage detection result, that no current leakage occurs and it is determined, based on the in-position signal, that the electronic device is in position, close the first switch using the control end of the first switch, so that the first direct current voltage output by the first voltage conversion circuit is able to charge the electronic device; and
the control circuit is further configured to: when it is determined that the current leakage occurs or that the electronic device is not in-position, open the first switch to prevent the first direct current voltage from charging the electronic device.

2. The charging apparatus according to claim 1, wherein the first switch is in an open state by default when the charging apparatus is coupled to the alternating current power supply.

3. The charging apparatus according to claim 1, wherein the in-position detection circuit comprises a contact switch, wherein the contact switch is configured to be pressed when the charging apparatus is coupled to the electronic device and to generate a first in-position signal that is used to indicate an in-position state.

4. The charging apparatus according to claim 1, wherein the in-position detection circuit is configured to detect, based on an identifier (ID) pin or a configuration channel (CC) pin on a charging interface of the electronic device, whether the electronic device is in position.

5. The charging apparatus according to claim 1, wherein the control circuit comprises a bleeder circuit, a comparator, and a NAND gate circuit;
the bleeder circuit is configured to divide the second direct current voltage to obtain a bleeder signal output by an output end of the bleeder circuit;
the output end of the bleeder circuit is coupled to an inverting input end of the comparator;
a non-inverting input end of the comparator is coupled to the voltage output end;
an output end of the comparator is coupled to one input end of the NAND gate circuit;
another input end of the NAND gate circuit is coupled to one end at which the in-position detection circuit outputs the in-position signal; and
an output end of the NAND gate circuit is coupled to the control end of the first switch.

6. The charging apparatus according to claim 1, wherein the current leakage detection circuit further comprises a second switch;
the second switch is coupled in series to a serial circuit comprising the output end of the second voltage conversion circuit, the serial resistor, and the voltage output end;
a control end of the second switch is coupled to the control circuit; and
the control circuit is further configured to control, using the control end of the second switch, the second switch to be in a closed state when the current leakage detection circuit detects whether the current leakage occurs.

7. The charging apparatus according to claim 6, wherein the control circuit is further configured to: when the first switch is closed, open the second switch using the control end of the second switch.

8. The charging apparatus according to claim 6, wherein the second switch is in a closed state by default when the charging apparatus is coupled to the alternating current power supply.

9. The charging apparatus according to claim 6, wherein one end, coupled to the control end of the first switch, of the control circuit is coupled to the control end of the second switch through a phase inverter.

10. The charging apparatus according to claim 1, wherein a voltage output by the second voltage conversion circuit is 1.8 V.

11. The charging apparatus according to claim 1, wherein the second voltage conversion circuit is a low dropout regulator.

12. A charging system, comprising an electronic device and a charging apparatus, wherein the charging apparatus is configured to charge the electronic device and comprises a charging circuit, a current leakage detection circuit, a control circuit, an in-position detection circuit, and a voltage output end, wherein the charging circuit comprises a first voltage conversion circuit and a first switch, wherein an input end of the first voltage conversion circuit is coupled to an alternating current power supply, an output end of the first voltage conversion circuit is coupled to the voltage output end through the first switch, and a control end of the first switch is coupled to the control circuit;

the current leakage detection circuit comprises a second voltage conversion circuit and a serial resistor, wherein an input end of the second voltage conversion circuit is coupled to the output end of the first voltage conversion circuit, an output end of the second voltage conversion circuit is coupled to the voltage output end through the serial resistor, and the current leakage detection circuit is configured to: detect whether current leakage occurs between the voltage output end and a ground, and output a current leakage detection result at the voltage output end;

the first voltage conversion circuit is configured to convert an input alternating current voltage into a first direct current voltage;

the second voltage conversion circuit is configured to convert the first direct current voltage into a second direct current voltage that is lower than the first direct current voltage and that does not trigger charging of the electronic device;

the in-position detection circuit is configured to: detect whether the electronic device is in position to obtain an in-position signal that is used to indicate whether the electronic device is in position, and output the in-position signal to the control circuit;

the control circuit is configured to: when it is determined, based on the current leakage detection result, that no current leakage occurs and it is determined, based on the in-position signal, that the electronic device is in position, close the first switch using the control end of the first switch, so that the first direct current voltage output by the first voltage conversion circuit is able to charge the electronic device; and the control circuit is further configured to: when it is determined that the current leakage occurs or that the electronic device is not in-position, open the first switch to prevent the first direct current voltage from charging the electronic device.

13. The charging system according to claim 12, wherein the first switch is in an open state by default when the charging apparatus is coupled to the alternating current power supply.

14. The charging system according to claim 12, wherein the in-position detection circuit comprises a contact switch, wherein the contact switch is configured to be pressed when the charging apparatus is coupled to the electronic device and to generate a first in-position signal that is used to indicate an in-position state.

15. The charging system according to claim 12, wherein the in-position detection circuit is configured to detect, based on an identifier (ID) pin or a configuration channel (CC) pin on a charging interface of the electronic device, whether the electronic device is in position.

16. The charging system according to claim 12, wherein the control circuit comprises a bleeder circuit, a comparator, and a NAND gate circuit;

the bleeder circuit is configured to divide the second direct current voltage to obtain a bleeder signal output by an output end of the bleeder circuit;

the output end of the bleeder circuit is coupled to an inverting input end of the comparator;

a non-inverting input end of the comparator is coupled to the voltage output end;

an output end of the comparator is coupled to one input end of the NAND gate circuit;

another input end of the NAND gate circuit is coupled to one end at which the in-position detection circuit outputs the in-position signal; and an output end of the NAND gate circuit is coupled to the control end of the first switch.

17. The charging system according to claim 12, wherein the current leakage detection circuit further comprises a second switch;

the second switch is coupled in series to a serial circuit comprising the output end of the second voltage conversion circuit, the serial resistor, and the voltage output end;

a control end of the second switch is coupled to the control circuit; and the control circuit is further configured to control, using the control end of the second switch, the second switch to be in a closed state when the current leakage detection circuit detects whether the current leakage occurs.

18. The charging system according to claim 17, wherein the control circuit is further configured to: when the first switch is closed, open the second switch using the control end of the second switch.

19. The charging system according to claim 17, wherein the second switch is in a closed state by default when the charging apparatus is coupled to the alternating current power supply.

20. The charging system according to claim 17, wherein one end, coupled to the control end of the first switch, of the control circuit is coupled to the control end of the second switch through a phase inverter.

\* \* \* \* \*